United States Patent
Yean et al.

(10) Patent No.: US 6,913,476 B2
(45) Date of Patent: Jul. 5, 2005

(54) TEMPORARY, CONFORMABLE CONTACTS FOR MICROELECTRONIC COMPONENTS

(75) Inventors: Tay Wuu Yean, Singapore (SG); Lee Choon Kuan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/228,771

(22) Filed: Aug. 27, 2002

(65) Prior Publication Data

US 2004/0029425 A1 Feb. 12, 2004

(30) Foreign Application Priority Data

Aug. 6, 2002 (SG) ......................... 200204730

(51) Int. Cl.$^7$ ................................. H01R 3/08

(52) U.S. Cl. .................................. 439/178

(58) Field of Search ........................ 439/179, 178; 324/757, 754, 758

(56) References Cited

U.S. PATENT DOCUMENTS

| | | | |
|---|---|---|---|
| 4,409,547 A | | 10/1983 | Lederman ............... 324/158 P |
| RE32,024 E | * | 11/1985 | Greig .......................... 324/754 |
| 4,587,484 A | | 5/1986 | Schulman ............... 324/158 F |
| 5,023,561 A | | 6/1991 | Hillard ....................... 324/719 |
| 5,036,271 A | | 7/1991 | Mazur et al. ............ 324/158 P |
| 5,037,773 A | | 8/1991 | Lee et al. ..................... 437/60 |
| 5,049,517 A | | 9/1991 | Liu et al. ...................... 437/52 |
| 5,140,272 A | | 8/1992 | Nishimatsu et al. ........ 324/662 |
| 5,550,482 A | * | 8/1996 | Sano .......................... 324/758 |
| 5,739,050 A | | 4/1998 | Farnworth .................... 438/15 |
| 5,786,621 A | | 7/1998 | Saif et al. ................... 257/415 |
| 5,815,000 A | | 9/1998 | Farnworth et al. .......... 324/755 |

(Continued)

OTHER PUBLICATIONS

Pal, I., "High–Density Sockets for GHz CSPs," Circuits Assembly, The Journal for Surface Mount and Electronic Assembly®, <URL: http://www.hdi-online.com>. Nov. 2000, pp. 26–29, UP Media Group, Inc., Atlanta, Georgia.

Light, D.N., High Density, Two Metal Layer Flex Interconnects for High Speed Applications [online]. Flex2Chip, Inc. [retreived on Apr. 23, 2003]. 9 pages. Retreived from the Internet: <URL: http://www.az-ww.com/pdf/Lightpaper2002.pdf>. Presented at the 2002 GHz Interconnect Workshop, Oct. 2002, Sedona, Arizona.

Sakelson, R. and S. Gold. Flexible Vision: Preparing for the High–Volume Flex Market. CircuiTree [online], [retreived on Apr. 23, 2003]. 13 pages. Jun. 1, 2002. Retreived from the Internet:<URL: http://www.circuitree.com/CDA/ArticleInformation/coverstory/BNPCoverStoryItem/0,2135,77804,00.html>.

Primary Examiner—Chandrika Prasad
(74) Attorney, Agent, or Firm—Perkins Coie LLP

(57) ABSTRACT

Various aspects of the invention provide temporary interfaces for microelectronic components, microelectronic component test systems, and methods of testing microelectronic components. One of the disclosed temporary interfaces employs a substrate having a plurality of terminals and a switch layer carrying a plurality of actuatable liquid switches. These switches may be adapted to conform to a surface of a component terminal to electrically connect the component terminal to a terminal of the substrate. Another adaptation provides a microelectronic component test system including a microelectronic component including a plurality of terminals. A body is juxtaposed with, but spaced from, the microelectronic component. The body carries a plurality of conduits and a conformable conductor is associated with each conduit. Each of these conformable conductors comprises a volume of electrically conductive liquid and the associated conduit.

64 Claims, 7 Drawing Sheets

OTHER PUBLICATIONS

| | | | |
|---|---|---|---|
| 5,891,744 A | 4/1999 | Lowrey et al. | 438/14 |
| 5,894,218 A | 4/1999 | Farnworth et al. | 324/158.1 |
| 5,969,534 A * | 10/1999 | Hubner et al. | 324/757 |
| 6,018,249 A | 1/2000 | Akram et al. | 324/758 |
| 6,025,728 A | 2/2000 | Hembree et al. | 324/755 |
| 6,072,323 A | 6/2000 | Hembree et al. | 324/755 |
| 6,081,429 A | 6/2000 | Barrett | 361/767 |
| 6,094,058 A | 7/2000 | Hembree et al. | 324/755 |
| 6,107,122 A | 8/2000 | Wood et al. | 438/117 |
| 6,113,406 A * | 9/2000 | Lin et al. | 439/179 |
| 6,150,717 A | 11/2000 | Wood et al. | 257/738 |
| 6,163,956 A | 12/2000 | Corisis | 29/832 |
| 6,188,232 B1 | 2/2001 | Akram et al. | 324/755 |
| 6,198,172 B1 | 3/2001 | King et al. | 257/797 |
| 6,208,156 B1 | 3/2001 | Hembree | 324/755 |
| 6,247,629 B1 | 6/2001 | Jacobson et al. | 228/4.5 |
| 6,255,833 B1 | 7/2001 | Akram et al. | 324/755 |
| 6,285,204 B1 | 9/2001 | Farnworth | 324/757 |
| 6,294,839 B1 | 9/2001 | Mess et al. | 257/777 |
| 6,368,887 B1 | 4/2002 | Lowrey et al. | 438/17 |

* cited by examiner

TEMPORARY, CONFORMABLE CONTACTS FOR MICROELECTRONIC COMPONENTS

CROSS-REFERENCE TO RELATED APPLICATION

This application claims foreign priority benefits of Singapore Application No. 200204730-6 filed Aug. 6, 2002, the entirety of which is incorporated herein by reference.

TECHNICAL FIELD

The present invention generally relates to forming temporary electrical connections with microelectronic components. The invention has particular utility in connection with testing microelectronic components, but can be used in a variety of other applications, as well.

BACKGROUND

The microelectronics industry is highly competitive and most microelectronics manufacturers are highly sensitive to quality and cost considerations. Most microelectronics manufacturers require that suppliers of microelectronic components test performance of each microelectronic component before shipment to minimize the manufacturer's product losses. Microelectronic components are commonly tested by establishing temporary electrical connections between a test system and electrical terminals on the microelectronic component.

One way of establishing a temporary electrical connection between the test system and the terminals on the component employs cantilevered wire probes. Such wire probes employ a stiff wire tip at the end of an elongate arm. Cantilevered wire probes are useful in some applications, e.g., in testing devices with bond pads spaced well apart from one another, but these probes do have some limitations. If the microelectronic component is a "bumped" chip having a solder ball attached to each of a series of bond pads, the mechanical force of the probe against the solder ball can damage the solder ball or the connection between the solder ball and the bond pad. This can lead to faulty electrical connections in future manufacturing steps. The minimum spacing of cantilevered wire probes is also somewhat constrained, limiting their use in testing microelectronic components with contacts that are close to one another, such as in fine ball grid array (FBGA) chips.

Another common way to temporarily electrically connect a microelectronic component to a test system employs a test card with rigid contacts. These contacts may be adapted to rigidly abut the component's contacts, e.g., a bond pad of an unbumped chip or contact solder balls on a bumped chip. Planarity of both the test card and the component contacts is of critical importance when testing unbumped chips. To ensure that the test card adequately contacts each of the bond pads, the microelectronic component must be urged toward the test card with some force. This could damage the microelectronic component under test. When testing bumped microelectronic components, the contacts on the test card may be specifically adapted to receive solder balls instead of contacting a relatively flat bond pad. These solder-specific contacts commonly scratch, squeeze, or otherwise deform the solder balls to ensure good electrical contact between the solder balls and the test card contacts. This can exert undue stress on the solder balls, damaging the solder balls or their connection to the underlying bond pads.

The trend in the industry is for terminals on microelectronic components to be spaced closer and closer together. Many microelectronic components, e.g., FBGA chips, have solder ball pitches (i.e., the distance from the center of one solder ball to the center of the next adjacent solder ball) of 0.8 millimeters or less; the solder balls on such contacts are often 0.3 millimeters or less in diameter. These small solder balls are very susceptible to damage when being deformed by a mechanical interface on a conventional test card. Test card manufacturers also are finding it increasingly difficult to position the terminals close enough to one another to permit testing of fine-pitch microelectronic components.

DETAILED DESCRIPTION

A. Overview

Figure 1:
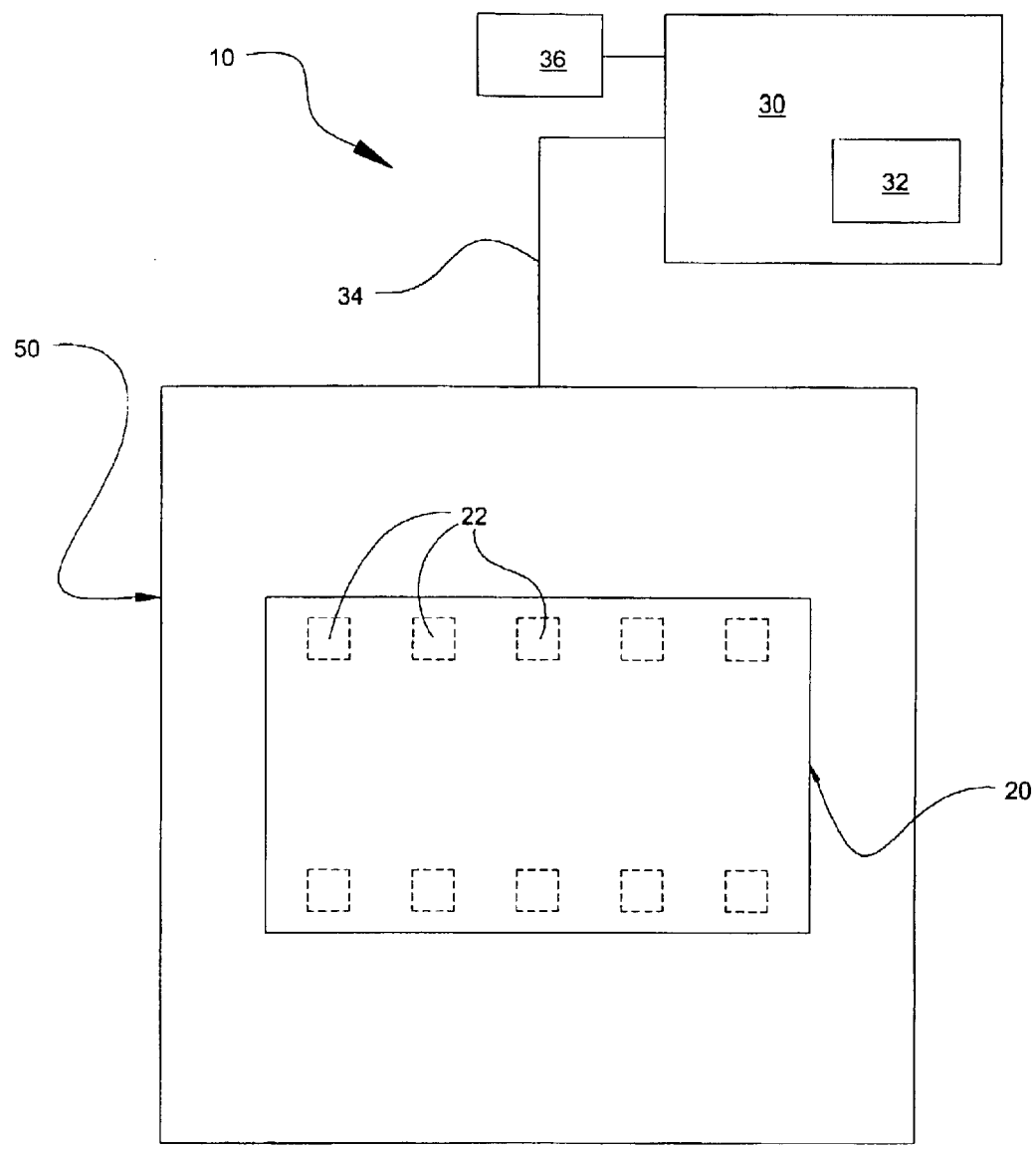
FIG. 1 is a schematic illustration of a microelectronic component test system of an embodiment of the invention.

Various embodiments of the present invention provide methods and apparatus for establishing temporary contact with microelectronic components, e.g., in testing the microelectronic components. Unless the specific context clearly requires otherwise, throughout the description and claims the terms "microelectronic component" and "microelectronic component assembly" may encompass a variety of articles of manufacture, including, e.g., semiconductor wafers having active components, individual integrated circuit dies, packaged dies, and subassemblies consisting of two or more microelectronic components, e.g., a stacked die package. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

In one embodiment, the present invention provides a temporary interface for a microelectronic component having a plurality of component terminals in a component terminal array. This temporary interface includes a substrate and a switch layer. The substrate has a plurality of substrate terminals arranged on a terminal surface of the substrate. The switch layer carries a plurality of acutatable liquid switches arranged in a switch array corresponding to the component terminal array. Each switch is associated with one of the substrate terminals and is adapted to conform to a surface of one of the component terminals to temporarily electrically connect the component terminal to the substrate terminal associated with the switch.

A temporary interface for a microelectronic component in accordance with another embodiment includes a body having a confronting surface, a plurality of electrically independent conduits, and a volume of electrically conductive liquid in each of the conduits. Each conduit has a contact end terminating adjacent the confronting surface. The contact ends may be arranged in a contact array configured to match a terminal array of component terminals on a microelectronic component.

Another embodiment of the invention provides a microelectronic component test system which includes a microelectronic component having a terminal surface and a plurality of terminals arranged in a terminal array on the terminal surface. The system also includes a body having a confronting surface that is juxtaposed with the terminal surface of the microelectronic component such that the terminals are spaced from the confronting surface by a gap. A plurality of electrically independent conduits are carried by the body, with each conduit having a contact end terminating adjacent the confronting surface of the body at a location proximate an associated one of the microelectronic component terminals. A conformable conductor is associated with each conduit. Each conformable conductor comprises a volume of electrically conductive liquid in the associated conduit.

A microelectronic component test system in accordance with an alternative embodiment includes a body having a confronting surface, a conduit carried by the body, an electrically conductive liquid in the conduit, and an electrically conductive flexible member. The flexible member is carried by the body adjacent the confronting surface and is adapted to resiliently return from a distended position toward a relaxed position. The flexible member assumes the distended position in response to pressure of the liquid against the flexible member. The flexible member is adapted to conform to a surface of a terminal of a microelectronic component when in the distended position.

Another embodiment of the invention provides a method of testing a microelectronic component having a plurality of component terminals on a component surface. In this method, the microelectronic component is juxtaposed with an interface having an interface surface and a plurality of liquid switches; the component surface is spaced from the interface surface. Each liquid switch is electrically contacted to an associated one of the component terminals by deforming a contact surface of each switch to conform to a surface of the associated component terminal without substantially deforming the component terminals. Electricity is conducted across an electrically conductive liquid of each of the switches and this liquid electrically connects the component terminal juxtaposed with the switch to a test terminal carried by the test interface.

In another embodiment, a method of testing a microelectronic component involves juxtaposing the microelectronic component with an interface having: an interface surface, a conduit, an electrically conductive liquid in the conduit, and an electrically conductive flexible member. When so juxtaposed, the surface of the component terminal is spaced from the flexible member by a gap. The flexible member is distended across the gap into conforming contact with the component terminal surface. Electricity is conducted across the flexible member with the flexible member in contact with the component terminal surface; the liquid and the flexible member electrically connect the component terminal to a test terminal carried by the interface.

B. Conformable Contact Systems

FIG. 1 schematically illustrates a microelectronic component test system 10 that may be used to test a microelectronic component 20. The microelectronic component test system 10 includes a test interface 50 that is connected to a controller 30. The test interface 50 includes a plurality of conformable contacts (not shown in FIG. 1) that may be positioned to contact electrical terminals 22 on the microelectronic component 20. The conformable contacts may be connected to circuitry (not shown) within the interface 50 adapted to deliver power to one or more of the contacts and/or receive test signals from one or more of the contacts.

The controller 30 may communicate with the circuitry of the test interface 50 by a communication line 34. The controller 30 may take any of a variety of forms. In one embodiment, the controller 30 comprises a computer having a programmable processor 32. The controller 30 may be operatively coupled to a power supply 36 and control delivery of power from the power supply 36 to various components of the test interface 50 via communication line 34. In one embodiment, a power supply 36 may be used to deliver test power to the contacts of the test interface 50 under the control of the controller 30.

As explained more fully below, some embodiments of the invention provide selectively conformable contacts that may be extended or retracted. In some embodiments, the contacts are open and allow conductive fluid to come into direct physical contact with a terminal 22 of the microelectronic component 20. In other applications, a flexible, conductive seal may be disposed between the conductive fluid and the microelectronic component terminal 22. The following discussion focuses first on embodiments illustrated in FIGS. 4–7, which illustrate contacts that may directly contact the terminals 22 of the microelectronic component 20. Next, embodiments that employ flexible, conductive seals are discussed in connection with FIGS. 8–11. Finally, several exemplary methods in accordance with other embodiments of the invention are described.

C. Open Contacts

Figure 2:
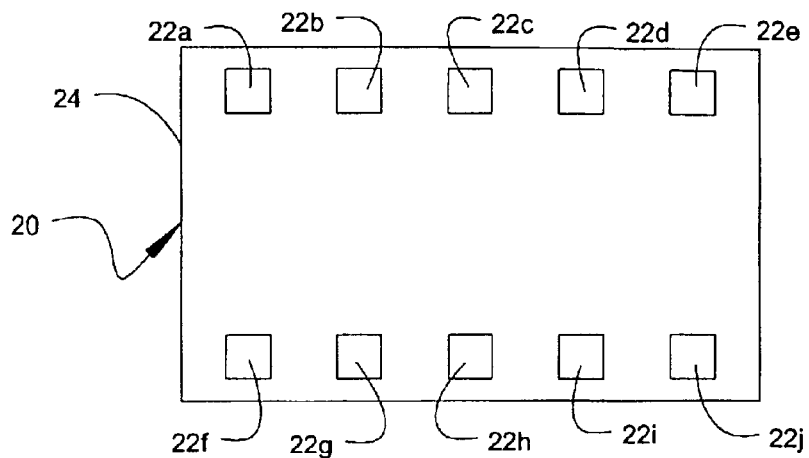
FIG. 2 is a schematic illustration of a microelectronic component to be tested.
Figure 3:
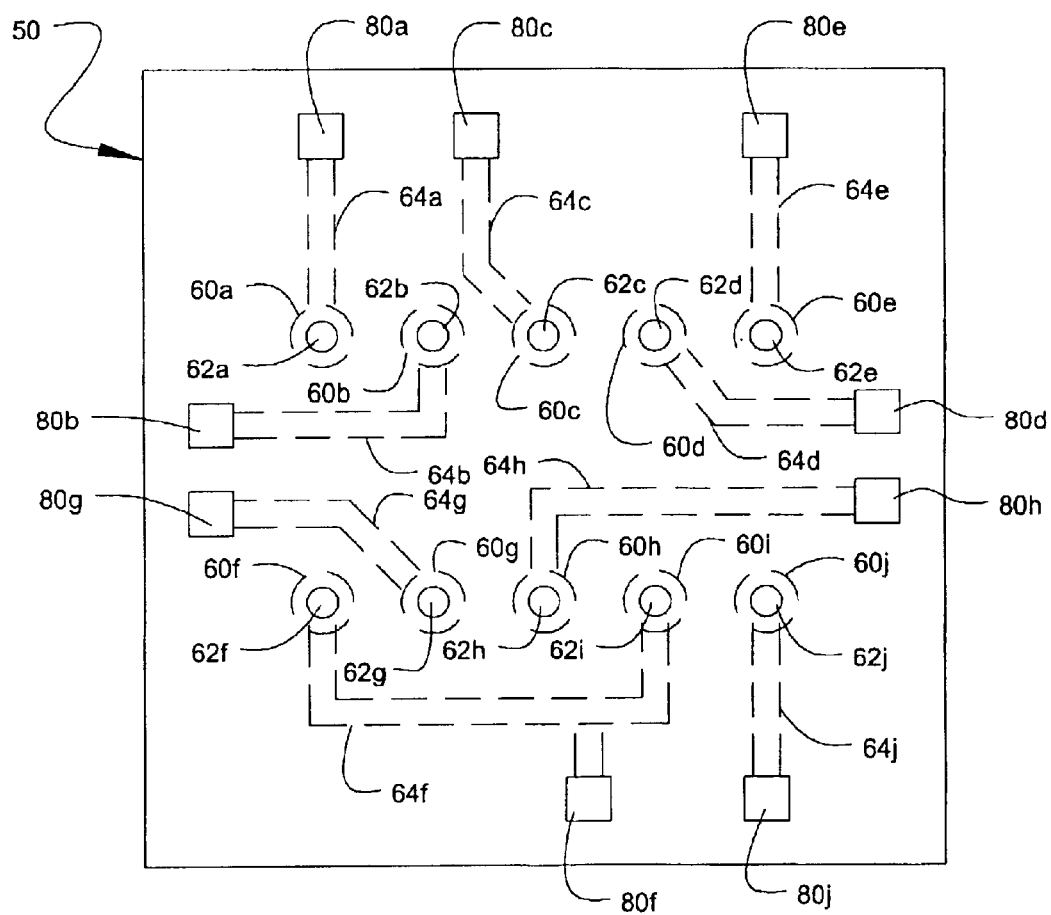
FIG. 3 is a schematic illustration of one embodiment of a microelectronic component interface configured to test the microelectronic component of FIG. 2.

FIG. 2 illustrates an idealized microelectronic component 20 and FIG. 3 schematically illustrates an interface 50 adapted to establish temporary electrical contact with the microelectronic component 20, e.g., for testing purposes. The microelectronic component 20 includes a body 24 carrying a plurality of terminals 22a–j on a terminal surface 28. The terminals are arranged in a terminal array having a first row of terminals 22a–e and a second row of terminals 22f–j. It should be recognized that this is merely an idealized example used to illustrate principles of one embodiment of the invention; the number and arrangement of terminals can be varied as needed for any specific application.

Any suitable microelectronic component 20 may be employed. For example, the microelectronic component 20 may be SIMM, DRAM, flash memory, or a processor. In one embodiment, the microelectronic component 20 is an integrated circuit die bearing a plurality of bond pads, such as a flip chip die or ball grid array (BGA) die. The microelectronic component 20 is illustrated in the drawings as a single element, but the microelectronic component 20 can comprise any number of sub-components. For example, the microelectronic component 20 may comprise one or more integrated circuit dies attached to a common substrate, such as in a packaged or unpackaged stacked die assembly. In other circumstances, it is desirable to test an entire semiconductor wafer to identify malfunctioning dies prior to singulation. In such a context, the microelectronic component 20 may comprise a semiconductor wafer bearing a plurality of integrated circuit dies.

The interface 50 illustrated in FIG. 3 includes a body 54 carrying a plurality of liquid switches 60a–j. Each of switches 60 has a contact opening 62 adjacent a confronting surface 56 of the body 54. Each of the switches 60a–j includes a conduit 64a–j, respectively. In one embodiment, each of the conduits 64a–j is electrically independent and is in communication with a single contact opening 62a–j, respectively. This need not be the case, though. In the embodiment shown in FIG. 3, many of the switches (e.g., switches 60a–e) have electrically independent conduits (64a–e, respectively) associated therewith. However, switches 60f and 60i share a common conduit 64f. Any suitable arrangement of conduits may be employed to achieve the desired electrical connections via the interface 50.

The interface 50 includes a plurality of actuators 80a–j, with each switch 60 being associated with one of the actuators 80. Hence, switches 60a–e are each associated with an independent actuator 80a–e, respectively. Switches 60f and 60i may be connected to a common actuator 80f via the common conduit 64f. As explained more fully below, the actuators 80 are adapted to move at least one of the switches 60 from a first, unactuated position to a second, actuated position. In one embodiment, each of the actuators 80 is independently controllable to independently actuate the or each associated switch 60. In another embodiment, all of the actuators 80 may be operated in unison. If so desired, operation of the actuators 80 may be controlled by the controller 30 (FIG. 1). In another embodiment, the actuators 80 may be controlled mechanically, e.g., by mechanically engaging the microelectronic component 20 when it is positioned proximate the interface 50.

Figure 4:
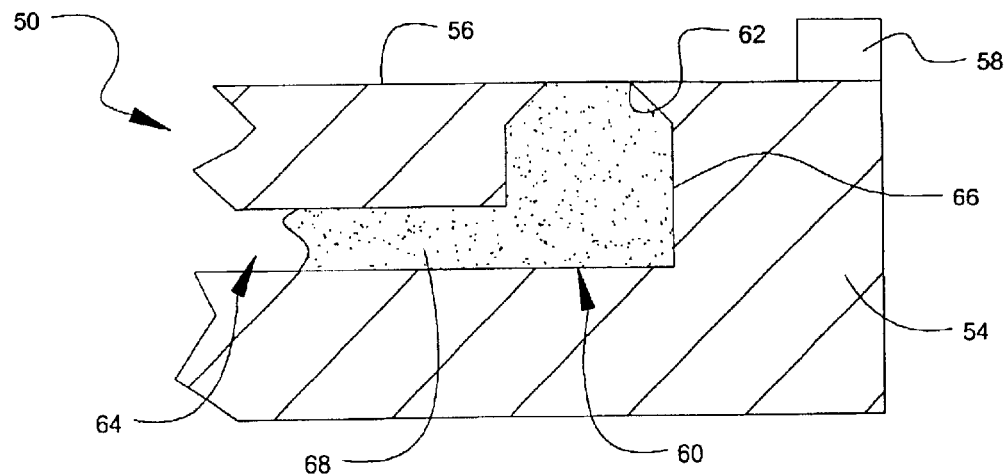
FIG. 4 schematically illustrates an actuatable liquid switch which may be employed in the microelectronic component interface of FIG. 3.
Figure 5:
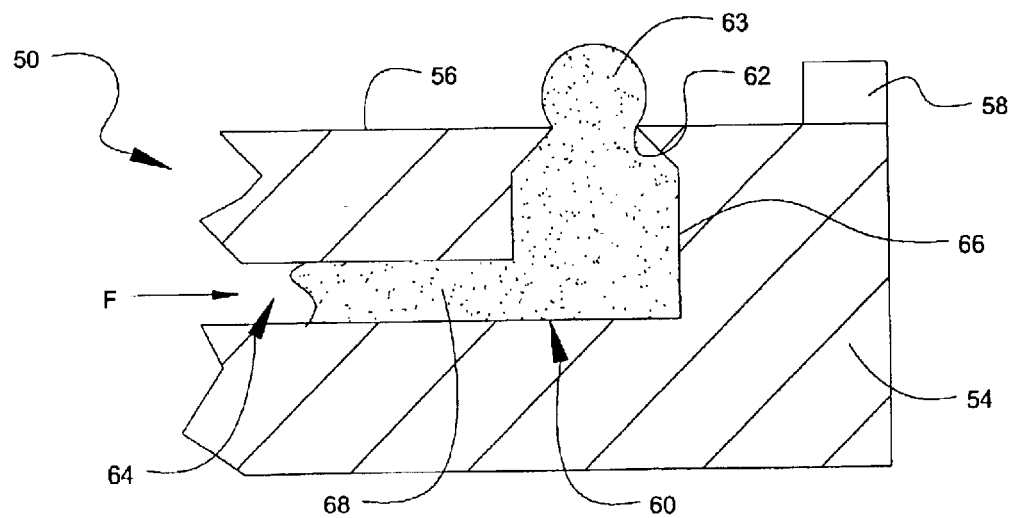
FIG. 5 schematically illustrates the liquid switch of FIG. 4 in an actuated configuration.
Figure 6:
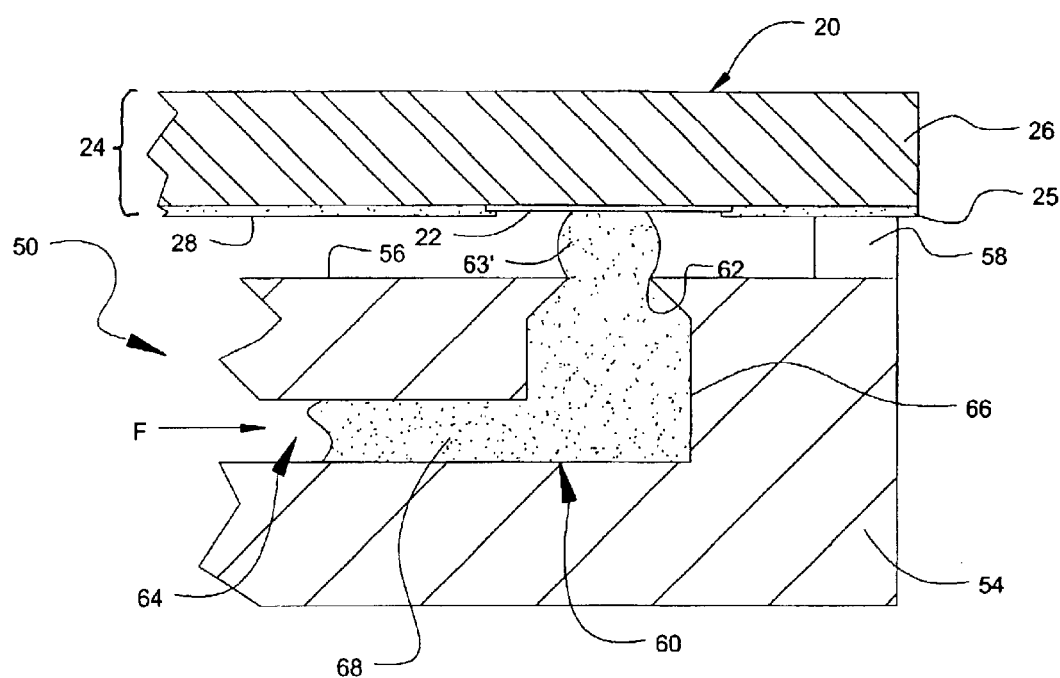
FIG. 6 is a schematic cross-sectional drawing illustrating temporary electrical connection of the liquid switch of FIGS. 4 and 5 to a flat terminal of a microelectronic component.

FIGS. 4–6 schematically illustrate operation of one of the liquid switches 60 of the interface 50 in FIG. 3. The switch 60 generally comprises a conduit 64 having a chamber 66 which terminates at a contact opening 62 in the confronting surface 56 of the interface 50. An electrically conductive liquid 68 is flowably received within the conduit 64. In one embodiment, the chamber 66 has an enlarged diameter and may serve as a reservoir for a volume of the liquid 68 to help accommodate variations in the operating temperature at which the interface 50 is used. In another embodiment, though, the chamber 66 has the same diameter as the rest of the conduit 64 and the contact opening 62. Although it is not shown in FIG. 3, the interface 50 may include one or more spacers (58 in FIGS. 4–6) positioned on the confronting surface 56. As explained more fully below in connection with FIG. 6, this can help reproducibly position the microelectronic component 20 with respect to the confronting surface 56 of the interface 50.

The switches 60 may be of any appropriate size and spacing to enable testing of a particular microelectronic component 20. It is anticipated that switches having contact openings on the order of 20–30 microns and a conduit having the same inner diameter will suffice if the liquid 68 has suitable electrical conductivity. This can facilitate positioning the contact openings closer to one another for testing microelectronic components with finer-pitch terminals. In one embodiment, the pitch of the contact openings 62 and the interface 50 is 100 microns or less. In one more specific embodiment, the pitch is reduced to about 75 microns or less. This is in contrast to more conventional contacts, which are effectively limited to pitches of about 120 microns or greater for most applications, often 200 microns or greater.

FIG. 5 schematically illustrates the same liquid switch 60 in an actuated condition. In the actuated condition, force is applied to the liquid 68 within the conduit 64, urging the liquid 68 toward the contact opening 62. This force, which is schematically shown in FIG. 5 as arrow F, may be exerted on the liquid 68 by the actuator 80 (not shown in FIG. 5). This will urge a quantity of the liquid 68 out of the contact opening 62. At least to some maximum diameter, surface tension of the liquid 68 will provide a relatively coherent volume of fluid which protrudes outwardly (i.e., upwardly in the orientation of FIG. 5) beyond the confronting surface 56 of the interface 50. This protruding volume of liquid defines a conformable contact 63 which can relatively readily deform to conform to a surface of a terminal 22 of a microelectronic component 20. If so desired, the confronting surface 56 of the body 54 may be provided with a coating (not shown) which is non-wettable by the liquid 68 to promote cohesion of the conformable contact 63.

FIG. 6 schematically illustrates the interface 50 electrically coupled to a microelectronic component 20. The microelectronic component 20 includes a body 24, which may comprise a semiconductor substrate 25 having multiple layers of metalization to define integrated circuitry, and a polyimide layer 26 or the like. In this particular embodiment, the terminal 22 takes the form of a bond pad, e.g., a metal bond pad of the type commonly employed in flip chips. The terminal surface 28 of the microelectronic component 20 abuts a surface of the spacer 58, spacing the terminal surface 28 of the microelectronic component 20 a known distance from the confronting surface 56 of the interface 50.

The switch 60 is in its actuated position in FIG. 6, similar to that shown in FIG. 5. In this position, the conformable contact 63 spans the gap between the terminal surface 28 and the confronting surface 56. As a consequence, the electrically conductive liquid 68 of the switch 60 provides a path to electrically connect the interface 50 to the microelectronic component 20. In the embodiment of FIG. 6, the liquid 68 has a high contact angle with the surface of the terminal 22. The liquid 68 may have a substantially non-wetting interface with the terminal 22. In another embodiment, the contact angle between the liquid 68 and the terminal 22 may be lower than illustrated in FIG. 6, which may promote wetting of the terminal 22.

Because of its flowable nature, the liquid 68 will deform where it is in contact with the terminal 22. As suggested by comparing FIGS. 5 and 6, the deformed contact 63' of FIG. 6 has a relatively flat area in direct physical contact with the terminal 22, which promotes good electrical contact between the liquid 68 and the terminal 22. Because the liquid 68 is flowable, however, it will not exert any undue physical force against the surface of the terminal 22. This can limit damage to the terminal 22, particularly as compared to a more conventional cantilevered wire probe or the like; in many applications, the contact 63' can adequately contact the terminal 22 substantially without deforming the terminal 22.

The conformable nature of the contact 63' can also be more forgiving of microelectronic components with slightly non-planar terminal surfaces 28. If the microelectronic component 20 were slightly warped, for example, some of the terminals 22 may be positioned closer to the confronting surface 56 of the interface 50 than shown in FIGS. 6 while other terminals 22 may be spaced somewhat farther away from the confronting surface 56. The conformable nature of the liquid will allow it to deform more to accommodate the position of terminals that are closer to the confronting surface 56 while still achieving adequate contact with terminals 22 that are spaced farther away.

Figure 7:
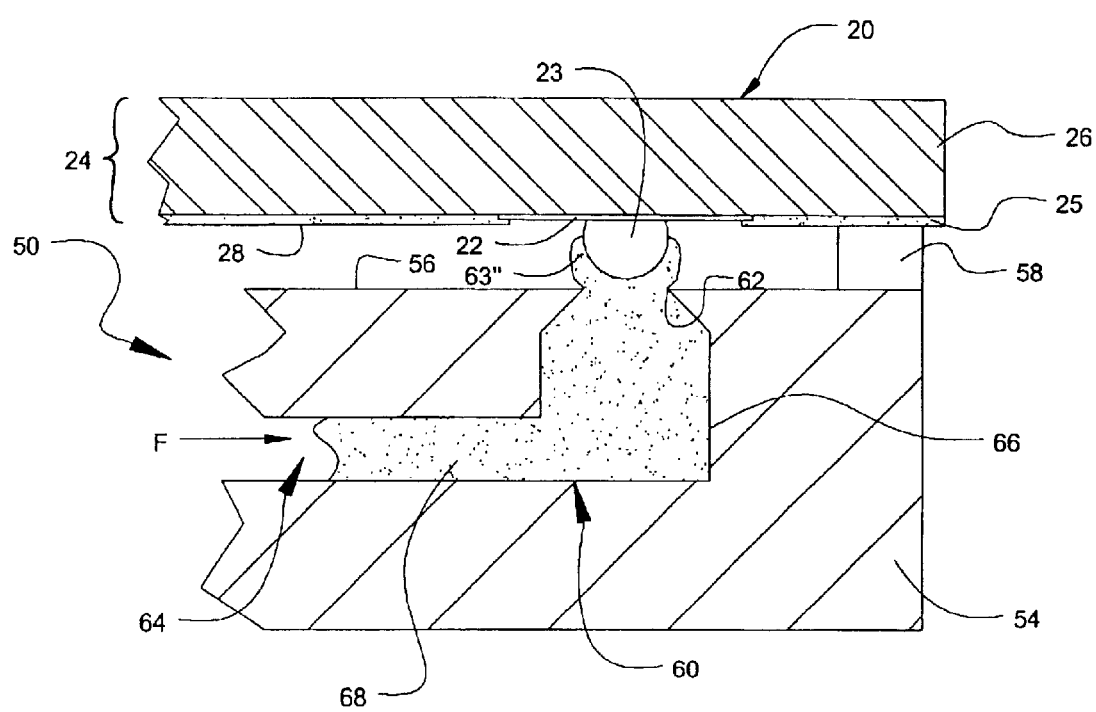
FIG. 7 is a schematic cross-sectional view, similar to FIG. 6, illustrating temporary electrical connection of the liquid switch of FIGS. 4 and 5 to a bumped terminal on a microelectronic component.

FIG. 7 schematically illustrates the liquid switch 60 of FIGS. 4–6 in its actuated condition to electrically contact a bumped terminal 22 of a microelectronic component 20. The microelectronic component 20 in FIG. 7 may be similar to the microelectronic component 20 shown in FIG. 6. The terminal 22 of FIG. 6 comprises a relatively flat bond pad. In FIG. 7, however, the terminal 22 includes a solder ball 23. Such a structure is common in BGA and FBGA chips. In some applications, the microelectronic component 20 may be tested prior to deposition of the solder balls 23, as illustrated in FIG. 6, and retested after the solder balls 23 have been applied, as shown in FIG. 7.

Much like the configuration of FIG. 6, the liquid 68 extending outwardly beyond the contact surface 56 of the interface body 54 may deform to conform to the surface of the solder ball 23. The conformable contact 63" shown in FIG. 7 has deformed significantly from the natural spherical structure illustrated in FIG. 5. Because the liquid 68 is flowable, though, the conformable contact 63" can deform to achieve a good electrical contact with the solder ball 23 without exerting undue force on the solder ball 23. This can facilitate testing of a bumped microelectronic component 20 even if the solder balls 23 are relatively small and delicate, such as those employed in FBGA chips. Solder balls 23 often form an oxide layer on their outer surface, which can inhibit electrical connection to the solder ball 23. If so desired, the solder balls 23 may be cleaned using conventional cleaning processes, such as plasma cleaning or chemical reduction, prior to testing with the interface 50.

Hence, the same electrical switch 60 can be used to test microelectronic components 20 having a variety of terminal configurations. For example, the same switches 60 may be used to test a relatively flat bond pad 22, as shown in FIG. 6, and a bumped bond pad bearing a solder ball 23, as shown in FIG. 7. Conventional systems tend to be dedicated to a more specific purpose—many test boards designed for use with bumped microelectronic components are incompatible with unbumped microelectronic components, and many test boards designed for use with unbumped microelectronic components would unduly damage bumped terminals.

In selecting a suitable liquid for use as the electrically conductive liquid 68 for the switches 60, a variety of factors may be taken into account. For example, the liquid 68 may be chemically compatible with the body 54 of the interface 50 and with the terminals 22 and other elements of the microelectronic component 20 to be tested. The liquid 68 may also be selected to remain in liquid form during all anticipated operating temperatures. In one embodiment useful for DRAM testing, the liquid 68 remains in a liquid state between about −20° C. and about 150° C. If the liquid is homogenous, it may have a melting point of −20° C. or less and a boiling point of 150° C. or more. The liquid 68 should also have suitable viscosity and electrical properties (e.g., conductivity) within the anticipated range of operating temperatures.

In one embodiment, the electrically conductive liquid 68 comprises mercury. Mercury has a melting point of about −39° C. and a boiling point of about 357° C. As a consequence, mercury would remain liquid over a wide range of operating conditions. In another embodiment, the liquid 68 comprises a non-homogenous material, such as a liquid with conductive solid particles suspended therein or an emulsion. A polymer having a suitable viscosity in the anticipated range of operating temperatures and having metal particles suspended therein may suffice.

D. Sealed Contacts

In the embodiments of FIGS. 4–7, the contact openings 62 of the interface 50 are open, exposing the electrically conductive liquid 68 to the atmosphere and bringing the liquid 68 directly into contact with the terminals 22 of the microelectronic component 20. FIGS. 8–11 illustrate embodiments of the invention employing liquid switches in which the electrically conductive liquid is substantially sealed from direct physical contact with the microelectronic component 20. This limits contamination of the electrically conductive liquid, volatilization and evaporation of the liquid, and problems with chemical compatibility between the liquid and the terminals 22 of the microelectronic components 20.

Figure 8:
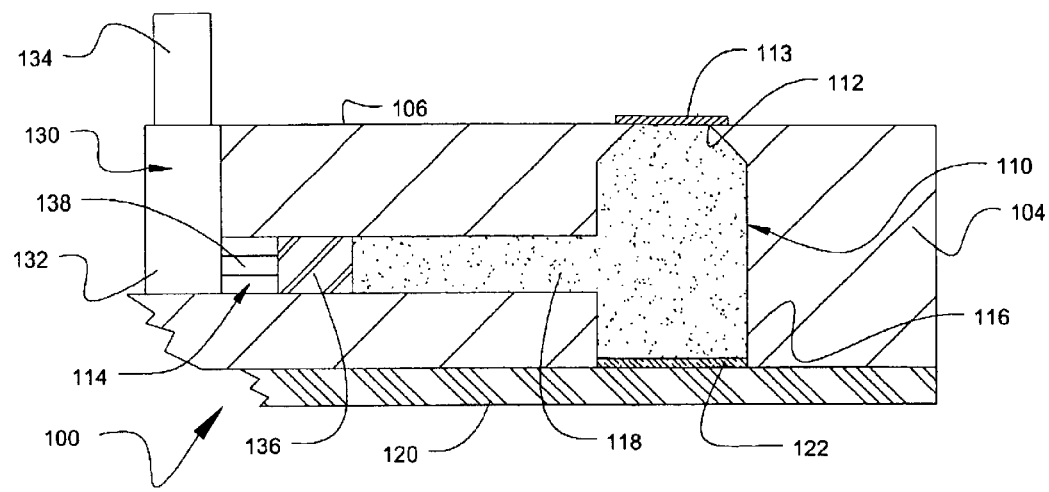
FIG. 8 is a schematic cross-sectional view illustrating aspects of a microelectronic component interface in accordance with an alternative embodiment.
Figure 9:
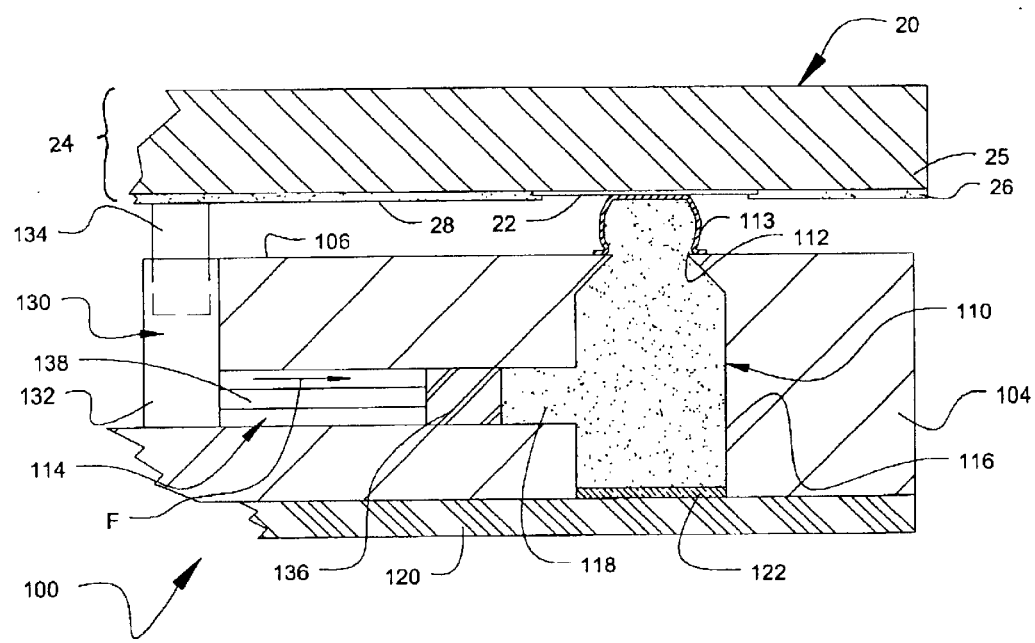
FIG. 9 schematically illustrates the microelectronic component interface of FIG. 8 in electrical contact with a terminal on a microelectronic component.

The interface 100 of FIGS. 8 and 9 includes a switch layer 104 carried on a substrate 120. The switch layer 104 has a confronting surface 106 spaced from the substrate 120 and a plurality of liquid switches 110 (only one of which is shown in FIG. 8). The substrate 120 includes a plurality of substrate terminals 122, with each substrate terminal 122 being in electrical contact with an electrically conductive liquid 118 of one of the switches 110. The switch 110 may include a conduit 114 in fluid communication with a chamber 116 which extends between the substrate terminal 122 and an opening 112 adjacent the confronting surface 106. The chamber 116 may have a diameter larger than the rest of the conduit 114 and the opening 112, as shown. In another embodiment, though, the chamber 116 has a diameter which is substantially the same as the diameter of the rest of the conduit 114 and the opening 112. The particular embodiment shown in FIGS. 8 and 9 employs a generally T-shaped conduit 114, with the chamber 116 oriented generally perpendicularly to the rest of the conduit 114. It should be understood, however, that a variety of other structures may be possible.

The opening 112 in the switch layer 104 is substantially sealed by a flexible member 113. The flexible member 113 may be sealed to the confronting surface 106 of the switch layer 104 in any suitable fashion, such as by heat sealing or an adhesive. The flexible member 113 should be adapted to deform under pressure of the liquid 118 acting thereon. In one embodiment, the flexible member 113 is also adapted to resiliently return toward the rest configuration shown in FIG. 8 when pressure of the liquid 118 against the flexible member 113 is reduced.

In one embodiment, the flexible member 113 comprises an electrically conductive flexible film that will conduct electricity through its thickness. This flexible film may comprise an elastomer that is electrically conductive or includes an electrically conductive material therein. In one embodiment, the flexible film comprises an elastomer having metal particles dispersed therein in sufficient density to make the film suitably electrically conductive. In another embodiment, the flexible member 113 comprises an elastomeric film with a plurality of metal wires contained therein. These metal wires (not shown in FIGS. 8–9) may extend through the thickness of the film from an inner surface in contact with the liquid 118 of the switch 110 to an outer surface oriented away from the substrate 120, yielding a film with anisotropic conductivity. In one particular adaptation, the flexible member 113 comprises a silicone rubber layer with gold-plated brass wires extending transversely at an angle through the thickness of the film. The gold-plated wires may protrude several microns from the inner and outer surfaces of the silicone rubber layer to facilitate good electrical contact with the liquid 118 and the microelectronics component terminal 22. Such a flexible film is suggested for use in a different application by IIa PaI in "High-Density Sockets for GHz CSPs," *HDI*, November 2000, at pages 26–29, the teachings of which are incorporated herein by reference.

The interface 100 of FIGS. 8 and 9 includes an actuator 130 having a housing 132 which slidably carries a button 134. A piston cylinder 136 may be slidably received within the conduit 114 and be operatively connected to the rest of the actuator 130 by a piston shaft 138. The housing 132 may include a force transfer mechanism that urges the piston cylinder 136 against the liquid 118 when the button 134 is depressed toward the substrate 120 (i.e., downwardly in FIG. 8). The transfer mechanism (not specifically shown) may, for example, comprise a hydraulic link, a pneumatic link, or a mechanical link. Hydraulic links may work well for smaller-scale applications.

The button 134 extends outwardly beyond the confronting surface 106 of the switch layer 104. As illustrated in FIG. 9, this permits the button 134 to abut the terminal surface 28 of a microelectronic component 20 to be tested. As the microelectronic component 20 is moved into position to juxtapose the terminal surface 28 with the interface confronting surface 106, the microelectronic component 20 will depress the button 134 toward the substrate 120. This will, in turn, urge the piston cylinder 136 against the liquid 118, as schematically indicated by the arrow F in FIG. 9. The pressure of the liquid 118 against the flexible member 113 will cause the flexible member 113 to distend outwardly beyond the confronting surface 106 of the switch layer 104. When the microelectronic component 20 is moved away from the interface 100, the button 134 may resiliently return toward the rest configuration shown in FIG. 8, e.g., by being spring-biased away from the substrate 120. This can, in turn, reduce pressure of the liquid 118 against the flexible member 113. In one embodiment, the flexible member 113 is sufficiently resilient to return toward its rest configuration shown in FIG. 8 when the liquid pressure is reduced.

As suggested in FIG. 9, the flexible member 113 provides a flexible contact surface which can deform to conform to the shape of the terminal 22 of the microelectronic component 20. The flexible member 113 distends outwardly to bridge the gap between the confronting surface 106 of the interface 100 and the terminal surface 28 of the microelectronic component 20. A portion of the flexible member 113 is deformed into conforming contact with the surface of the component terminal 22 substantially without deforming the component terminal 22. Although a relatively flat terminal 22 is shown in FIG. 9, the same principle can apply to terminals having other shapes, such as a bumped terminal as shown in FIG. 7.

Figure 10:
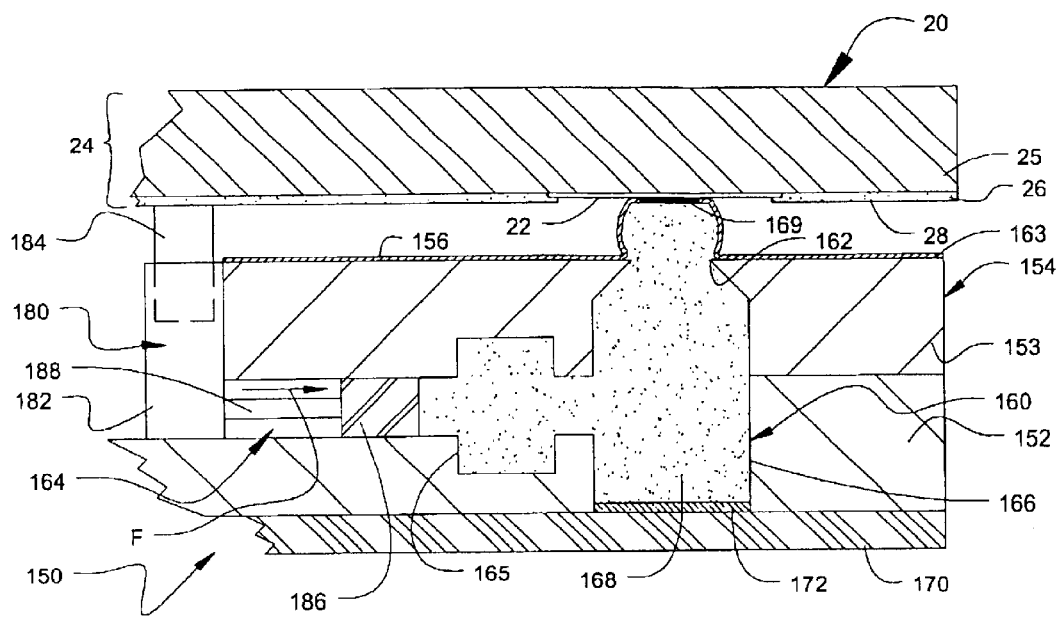
FIG. 10 is a schematic cross-sectional view, similar to FIG. 9, but illustrating an alternative microelectronic component interface.
Figure 11:
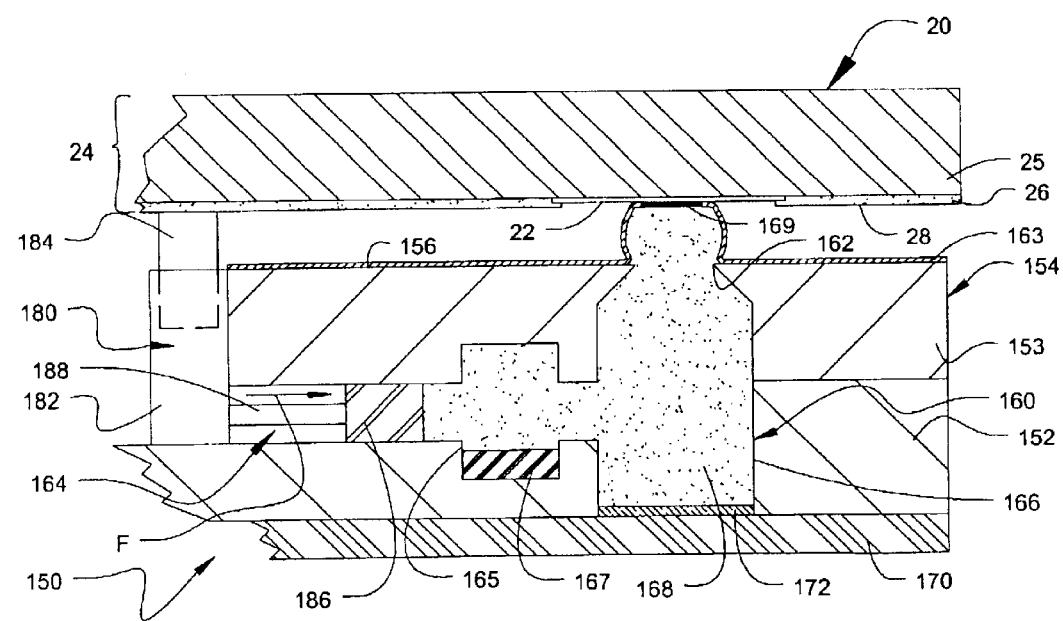
FIG. 11 is a schematic cross-sectional view of the microelectronic component interface of FIG. 10 modified to accommodate a different operating condition.

FIGS. 10 and 11 schematically illustrate a microelectronic component test system in accordance with another embodiment of the invention. This microelectronic component test system includes an interface 150 that is similar in some respects to the interface 100 of FIGS. 8 and 9. The interface 150 includes a substrate 170 carrying a plurality of substrate terminals 172 and a switch layer 154. The switch layer 154 includes a plurality of liquid switches 160 (only one of which is shown in FIGS. 10 and 11). The switches 160 are actuated by an actuator 180 which includes a housing 182 and a button 184 which is slidable with respect to the housing 182 to move a piston cylinder 186, using a piston shaft 188, to exert a force F on the cylinder 186.

One difference between the interface 150 of FIGS. 10 and 11 and the interface 100 of FIGS. 8 and 9 lies in the liquid switch 160. The liquid switch 160 of FIGS. 10 and 11 includes a conduit 164 having a chamber 166 which extends between the substrate terminal 172 and an opening 162. A flexible member 163 is attached to the confronting surface 156 of the switch layer 154. In one embodiment, the flexible member 163 may comprise a small patch of an electrically conductive flexible film, much like the flexible member 113 discussed above. In the embodiment of FIGS. 10 and 11, though, the flexible member 163 of each liquid switch 160 comprises an area of a continuous electrically insulative film. This film may be sealed to the rest of the switch layer 154 adjacent the contact opening 162 of each of the switches 160, with the remainder of the electrically insulative film spanning the space between the contact openings 162. In particular, the illustrated flexible member 163 comprises an electrically insulative elastomeric film having a metalized contact 169 positioned to electrically contact the liquid 168. In one embodiment, the metalized contact 169 comprises a metal-filled via that extends through the electrically insulative film. The metal may extend laterally beyond the dimensions of the via to expand the useful contact area. Flexible films including such metalized contacts 169 are commercially available from a variety of sources, including Flex2Chip, Inc. of San Jose, Calif., U.S.A. A separate metallized contact 169 may be associated with each of the liquid switches 160.

The switch 160 also includes an adjustable reservoir 165 disposed along the length of the conduit 164. In the illustrated embodiment, this reservoir 165 is distinct from the chamber 166 and is spaced therefrom. In another embodiment, the chamber 166 may serve as the adjustable volume reservoir 165. The volume of the reservoir 165 may be adjusted by occupying part of the reservoir volume with an insert 167 reducing the volume of the electrically conductive liquid 168 in the reservoir 165.

For example, the insert 167 may be a hydraulically inflatable bladder; inflating the bladder will occupy more of the reservoir 165. In the illustrated embodiment, the insert 167 may comprise a separate solid or hollow element which can be physically placed in or removed from the reservoir 165. The switch layer 154 may comprise an inner plate 152 and an outer plate 153. The inner and outer plates may each have complementary channels that together define the conduit 164 when the two plates 152 and 153 are assembled as shown. By lifting the outer plate 153 away from the inner plate 152, one can gain access to the reservoir 165 of each of the liquid switches 160 and insert an appropriately sized insert 167 therein.

The insert 167, as noted above, changes the volume of the liquid switch available to retain the liquid 168. Many liquids will expand with increasing temperatures. If the interface 150 is to be used at different use temperatures, an appropriately sized insert 167 can be used to adapt the interface 150 for optimum performance at the intended use temperature. FIG. 10 illustrates the interface 150 configured for use at a first temperature. When the button 184 is depressed by the microelectronic component 20, the piston cylinder 166 will be displaced a fixed distance, driving the flexible member 163 into conforming contact with the terminal 22 of the microelectronic component 20. If the same interface 150 were used at a lower temperature, the same quantity of liquid 168 may occupy less space. As a consequence, moving the piston cylinder 186 the same distance in response to depressing the button 184 may be insufficient to establish adequate electrical contact with the terminal 22. The insert 167 may occupy a volume which is correlated to the change in volume of the liquid 168 between the upper and lower temperatures. Hence, the insert 167 allows the conduit 164 to be resized so the performance of the liquid switch 160 will be comparable at different use temperatures. This limits the need for separate, temperature-specific interfaces to test the same microelectronic component configuration at multiple temperatures.

E. Methods

As noted above, some embodiments of the invention provide methods of testing microelectronic components 20. Test interfaces having a conformable contact (or an array of conformable contacts) positioned to contact a terminal on the microelectronic component provide a range of processing possibilities. The following discussion outlines select applications of these test interfaces; other applications for these test interfaces will become apparent to those skilled in the art in light of the present disclosure.

The following discussion refers back to the specific embodiments illustrated in FIGS. 1–11. It should be understood that this is solely for purposes of illustration and that the methods are not to be limited to the specific structures shown in these drawings. In particular, any test interface which is suitable to perform the described function may be employed, even if that test interface differs from the structures outlined above and shown in FIGS. 1–11.

A method of testing a microelectronic component in accordance with one embodiment of the invention may involve juxtaposing a microelectronic component 20 having a plurality of component terminals 22 with an interface (100, for example) having a plurality of liquid switches 110. In particular, the terminal surface 28 of the microelectronic component 20 may be positioned generally parallel to, but spaced from, the confronting surface 106 of the interface 100.

Each of the liquid switches 110 may be brought into electrical contact with an associated one of the component terminals 22 by deforming a contact surface of the switch 110 to conform to a surface of the associated terminal 22. In the embodiment of FIGS. 8 and 9, for example, this may be accomplished as the microelectronic component is brought into position with respect to the interface 100. In particular, the microelectronic component 20 may depress the button 134 of the actuator 130 which, in turn, distends the flexible member 113 outwardly beyond the confronting surface 106 of the interface 100. The flexible member 113 will deform to conform to the surface terminal 22 in response to pressure of the electrically conductive liquid 118 against the flexible member 113.

In another embodiment, positioning the microelectronic component 20 with respect to the interface 100 need not activate the actuators 130. In such an embodiment, the actuators 130 may be selectively activated by a controller (30 in FIG. 1), for example. In this adaptation of the method, the flexible member 113 of each liquid switch 110 may be juxtaposed with, but spaced from, an associated component terminal 22. Thereafter, the flexible members 113 may be distended to establish electrical contact between the liquid switches 110 and the component terminals 22.

With the liquid switches 110 in electrical contact with the microelectronic component terminals 22, electricity may be conducted across the liquid 118 of each of the switches 110, electrically connecting one of the microelectronic component terminals 22 to a signal processor (e.g., processor 32 in FIG. 1). In the embodiment of FIGS. 4–7, each of the electrically independent volumes of conductive liquid 68 may be independently connected to the communication line 34 via circuitry (not shown) within the interface 50. In the embodiments of FIGS. 8–11, the liquid 118 conducts electricity between the microelectronic component terminal 22 and the substrate terminal 122 and the substrate 120 may include suitable circuitry (not shown) to facilitate connection to the communication line 34.

As noted above, the liquid switches 60 of FIGS. 4–7 can establish electrical contact with a terminal 22 of a microelectronic component 20 by direct physical contact of the conductive liquid 68 to the terminal 22. The liquid switches 110 and 160 of FIGS. 8–11 employ a flexible member (113 and 163, respectively) disposed between the electrically conductive liquid and the microelectronic component terminal 22. Hence, the flexible member (113, for example) may serve as an electrical bridge between the liquid 118 and the microelectronic component terminal 22.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. When the claims use the word "or" in reference to a list of two or more items, that word covers all of the following interpretations of the word: any of the items in the list, all of the items in the list and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform steps in a different order. Aspects of the invention may also be useful in other applications, e.g., in forming temporary or stress-tolerant electrical contact with a microelectronic component for purposes other than testing. The various embodiments described herein can be combined to provide further embodiments.

In general, the terms used in the following claims should not be construed to limit the invention to the specific embodiments disclosed in the specification, unless the above detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:

1. A temporary interface for a microelectronic component having a plurality of component terminals in a component terminal array, comprising:

a substrate having a plurality of substrate terminals arranged on a terminal surface of the substrate; and a switch layer carrying a plurality of actuatable liquid switches arranged in a switch array corresponding to the component terminal array, each switch being associated with one of the substrate terminals and being adapted to conform to a surface of one of the component terminals to temporarily electrically connect the component terminal to the substrate terminal associated with the switch.

2. The temporary interface of claim 1 wherein the liquid switches are actuatable independently of one another.

3. The temporary interface of claim 1 wherein the liquid switches are adapted to be actuated in unison.

4. The temporary interface of claim 1 wherein each of the liquid switches comprises a conduit and an electrically conductive liquid contained in the conduit.

5. The temporary interface of claim 1 wherein each of the liquid switches comprises a conduit having a contact end adjacent a confronting surface of the switch layer, an electrically conductive liquid contained in the conduit, and an actuator adapted to move a contact surface of the switch outwardly beyond the confronting surface to contact one of the component terminals.

6. The temporary interface of claim 1 wherein each of the liquid switches comprises a conduit and an electrically conductive liquid contained in the conduit, the liquid remaining in a liquid state in a temperature range of about 20° C. to about 150° C.

7. The temporary interface of claim 1 wherein each of the liquid switches comprises a conduit and liquid mercury contained in the conduit.

8. The temporary interface of claim 1 wherein each of the liquid switches comprises a conduit and an electrically conductive liquid contained in the conduit, the liquid comprising a liquid component having conductive solid particles suspended therein.

9. The temporary interface of claim 1 wherein each of the liquid switches comprises an electrically conductive liquid and an electrically conductive flexible member, the flexible member being adapted to conform to the component terminal surface under pressure of the liquid.

10. The temporary interface of claim 9 wherein the flexible member comprises an elastomeric films.

11. The temporary interface of claim 9 wherein the flexible member comprises an electrically insulative film having a conductive contact positioned to electrically contact the liquid.

12. The temporary interface of claim 1 wherein each of the liquid switches comprises a conduit and an electrically conductive liquid contained in the conduit, the conduit being resizable to accommodate different use temperatures.

13. The temporary interface of claim 1 further comprising a control button adapted to actuate at least one of the liquid switches in response to force of a surface of the microelectronic component against the control button.

14. The temporary interface of claim 1 further comprising a plurality of control buttons, each control button being adapted to actuate an associated liquid switch in response to force of a surface of the microelectronic component against the control button.

15. A temporary interface for a microelectronic component having a plurality of component terminals, comprising:
    a substrate having a plurality of substrate terminals arranged on a terminal surface of the substrate; and
    a switch layer carrying a plurality of switch means arranged in a switch array, first and second ones of the switch means each being moveable with respect to the substrate from a first position to a second position, wherein the first and second switch means are associated with the substrate terminals and, when in their respective second positions, are adapted to deform to conform to surfaces the component terminals to temporarily electrically connect the component terminals to the substrate terminals associated with the first and second switch means.

16. A temporary interface for a microelectronic component, comprising:
    a body having a confronting surface;
    a plurality of electrically independent conduits, each conduit having a contact end terminating adjacent the confronting surface, the contact ends being arranged in a contact array configured to match a terminal array of component terminals on a microelectronic component;
    a first volume of electrically conductive liquid in a first one of the conduits;
    a second volume of electrically conductive liquid in a second one of the conduits; and
    actuator means adapted to move the first and second volumes in their respective conduits.

17. The temporary interface of claim 16 wherein the actuator means comprises a first actuator associated with the first conduit and a second actuator associated with the second conduit, each of the first and second actuators being adapted to move a surface of the liquid from a first position to a second position, the liquid surface in its second position extending outwardly beyond the confronting surface.

18. The temporary interface of claim 17 further comprising a button positioned outwardly beyond the confronting surface and adapted to contact a surface of the microelectronic component, the button being operatively associated with at least one of the first and second actuators.

19. The temporary interface of claim 16 further comprising a plurality of electrically conductive flexible members, each of which is associated with one of the contact ends, each flexible member being adapted to conform to a surface of one of the component terminals.

20. The temporary interface of claim 19 further comprising an actuator adapted to move at least one of the flexible members outwardly beyond the confronting surface to contact one of the component terminals.

21. The temporary interface of claim 19 wherein the flexible member comprises an elastomeric film.

22. The temporary interface of claim 16 wherein at least one of the conduits is resizable to accommodate different use temperatures.

23. The temporary interface of claim 16 wherein at least one of the conduits includes a reservoir and an insert in the reservoir to reduce a volume of the liquid in the reservoir.

24. A microelectronic component test system, comprising:
    a microelectronic component having a terminal surface and a plurality of terminals arranged in a terminal array on the terminal surface;
    a body having a confronting surface, the confronting surface of the body being juxtaposed with the terminal surface of the microelectronic component such that the terminals are spaced from the confronting surface by a gap;
    electrically independent first and second conduits carried by the body, each of the first and second conduits having a contact end terminating adjacent the confronting surface at a location proximate an associated one of the microelectronic component terminals;
    a first conformable conductor associated with the first conduit and a second conformable conductor associated with the second conduit, each of the first and second conformable conductors comprising a volume of electrically conductive liquid in the associated conduit; and
    an actuator associated with the first conduit and adapted to actuate the first conductor from a first position to a second position.

25. The microelectronic component test system of claim 24 wherein each of the first and second conformable conductors includes a contact surface conforming to a surface of one of the microelectronic component terminals.

26. The microelectronic component test system of claim 24 wherein the liquid of the first conformable conductor extends across the gap between the terminal surface and the confronting surface into physical contact with a surface of one of the microelectronic component terminals.

27. The microelectronic component test system of claim 26 wherein the microelectronic component terminal surface is not wettable by the liquid.

28. The microelectronic component test system of claim 24 wherein each of the first and second conformable conductors includes an electrically conductive flexible member disposed between the liquid and the microelectronic component.

29. The microelectronic component test system of claim 28 wherein at least one of the flexible members is in electrical contact with one of the microelectronic component terminals.

30. The microelectronic component test system of claim 28 wherein each of the first and second flexible members is in electrical contact with a different one of the microelectronic component terminals.

31. The microelectronic component test system of claim 28 wherein each of the first and second flexible members is adapted to conform to a surface of one of the microelectronic component terminals.

32. The microelectronic component test system of claim 28 wherein the first and second flexible members each comprise an elastomeric film.

33. The microelectronic component test system of claim 28 wherein the first and second flexible members each comprise an electrically insulative film having a metallized contact positioned to electrically contact the liquid.

34. The microelectronic component test system of claim 28 wherein both of the flexible members comprise areas of a continuous film, with each flexible member sealing the associated contact end.

35. The microelectronic component test system of claim 28 wherein both of the flexible members comprise areas of an electrically insulative continuous film, each flexible member having a conductive contact positioned to electrically contact the liquid.

36. The microelectronic component test system of claim 24 wherein the actuator is adapted to move the associated conformable conductor from the first position to the second position by moving the liquid, the conformable conductor in its second position electrically contacting one of the microelectronic component terminals.

37. The microelectronic component test system of claim 24 wherein at least one of the conduits is resizable to accommodate different use temperatures.

38. The microelectronic component test system of claim 24 wherein at least one of the conduits includes a reservoir and an insert in the reservoir to reduce a volume of the liquid in the reservoir.

39. A microelectronic component test system, comprising:
a body having a confronting surface;
a conduit carried by the body;
an electrically conductive liquid in the conduit; and
an electrically conductive flexible member carried by the body adjacent the confronting surface and adapted to resiliently return from a distended position toward a relaxed position, the flexible member assuming the distended position in response to pressure of the liquid against the flexible member, the flexible member being adapted to conform to a surface of a terminal of a microelectronic component when in the distended position.

40. The microelectronic component test system of claim 39 further comprising a microelectronic component having a component surface juxtaposed with the confronting surface and spaced therefrom by a gap.

41. The microelectronic component test system of claim 40 wherein the flexible member, in its distended position, spans the gap and conforms to the surface of the terminal of the microelectronic component.

42. The microelectronic component test system of claim 39 wherein the body carries a body terminal spaced from the flexible member and the liquid electrically connects the flexible member to the body terminal.

43. The microelectronic component test system of claim 42 wherein the flexible member in its distended position is adapted to electrically connect the body terminal to the microelectronic component terminal across a gap between the confronting surface and the microelectronic component terminal.

44. The microelectronic component test system of claim 39 wherein the flexible member in its distended position extends outwardly beyond the confronting surface.

45. The microelectronic component test system of claim 39 further comprising an actuator adapted to act against the liquid to move the flexible member from the rest position to the distended position.

46. The microelectronic component test system of claim 39 wherein the flexible member comprises an elastomeric film.

47. The microelectronic component test system of claim 39 wherein the flexible member comprises an electrically insulative film having a metallized contact positioned to electrically contact the liquid.

48. The microelectronic component test system of claim 39 wherein the conduit includes a reservoir and an insert in the reservoir to reduce a volume of the liquid in the reservoir.

49. A method of testing a microelectronic component having a plurality of component terminals on a component surface, comprising:
juxtaposing the microelectronic component with an interface having an interface surface and a plurality of liquid switches, the component surface being spaced from the interface surface;
actuating first and second ones of the liquid switches to electrically contact each of the first and second switches to an associated one of the component terminals by deforming a contact surface of each of the first and second switches to conform to a surface of the associated component terminal without substantially deforming the component terminals; and
conducting electricity across an electrically conductive liquid of each of the first and second switches, the liquid of each switch electrically connecting the component terminal juxtaposed with the switch to a test terminal carried by the test interface.

50. The method of claim 49 further comprising moving each of the first and second switches to a retracted configuration by moving a surface of the electrically conductive liquid of the switch away from the microelectronic component.

51. The method of claim 49 wherein the contact surface of each of the first and second switches comprises a surface of the electrically conductive liquid of the switch, the liquid surface deforming to conform to the associated component terminal surface.

52. The method of claim 51 wherein the liquid directly contacts, but does not wet, the component terminal surface.

53. The method of claim 49 wherein the contact surface of each of the first and second switches comprises an electrically conductive flexible member, deforming the contact surface to conform to the associated component terminal surface comprising deforming the flexible member in response to pressure of the liquid against the flexible member.

54. The method of claim 49 wherein each of the first and second switches is juxtaposed with, but spaced from, the associated component terminal prior to electrically contacting the liquid switches to the associated component terminals.

55. The method of claim 49 wherein the interface includes an actuator button positioned to contact the component surface of the microelectronic component, electrically contacting each switch to the associated component terminal comprising forcing the microelectronic component against the actuator button to urge the contact surfaces of the switches outwardly beyond the interface surface.

56. A method of testing a microelectronic component having a component terminal on a component surface, comprising:

juxtaposing the microelectronic component with an interface having an interface surface, a conduit, an electrically conductive liquid in the conduit, and an electrically conductive flexible member, a surface of the component terminal being spaced from the flexible member by a gap;

distending the flexible member across the gap into conforming contact with the component terminal surface; and conducting electricity across the flexible member with the flexible member in contact with the component terminal surface, the liquid and the flexible member electrically connecting the component terminal to a test terminal carried by the interface.

57. The method of claim 56 wherein the flexible member is distended under pressure of the liquid against the flexible member.

58. The method of claim 57 further comprising reducing pressure of the liquid against the flexible member, allowing the flexible member to resiliently move away from the component terminal.

59. An interface for a microelectronic component, comprising a plurality of actuatable liquid switches arranged in a switch array, wherein at least one of the liquid switches comprises an electrically conductive liquid and an electrically conductive flexible member, the flexible member being adapted to conform to a surface of a component terminal carried by the component to temporarily electrically connect the component terminal to the electrically conductive liquid.

60. The interface of claim 59 wherein the conduits are formed in a body having a surface, further comprising an actuator adapted to move the flexible member outwardly beyond the surface of the body to contact the component terminal.

61. The temporary interface of claim 59 wherein the flexible member comprises an elastomeric film.

62. A temporary interface for a microelectronic component carrying terminals, comprising a plurality of electrically independent conduits in a body, the conduits carrying an electrically conductive liquid and having contact ends terminating adjacent a surface of the body, and a plurality of electrically conductive flexible members associated with the contact ends of the conduits, the flexible members being adapted to deform to conform to surfaces of the terminals to electrically connect the electrically conductive liquid to the microelectronic component.

63. The temporary interface of claim 62 further comprising an actuator adapted to move at least one of the flexible members outwardly beyond the confronting surface to contact one of the terminals of the component.

64. The temporary interface of claim 62 wherein the flexible members comprise an elastomeric film.

* * * * *

UNITED STATES PATENT AND TRADEMARK OFFICE
CERTIFICATE OF CORRECTION

PATENT NO.    : 6,913,476 B2
DATED         : July 5, 2005
INVENTOR(S)   : Tay Wuu Yean et al.

It is certified that error appears in the above-identified patent and that said Letters Patent is hereby corrected as shown below:

Column 13,
Line 37, "films" should be -- film --.

Signed and Sealed this

Eighth Day of November, 2005

JON W. DUDAS
*Director of the United States Patent and Trademark Office*